(12) United States Patent
Song et al.

(10) Patent No.: US 6,373,778 B1
(45) Date of Patent: Apr. 16, 2002

(54) BURST OPERATIONS IN MEMORIES (75) Inventors: Jin Seung Song, Campbell, CA (US);
Li-Chun Li, Los Gatos, CA (US)

(73) Assignee: Mosel Vitelic, Inc., Taiwan (TW)

( * ) Notice: Subject to any disclaimer, the term of this patent is extended or adjusted under 35 U.S.C. 154(b) by 0 days.

(21) Appl. No.: 09/493,299

(22) Filed: Jan. 28, 2000

(51) Int. Cl.[7] .............................................. G11C 8/00
(52) U.S. Cl. ............................. 365/230.04; 365/230.03
(58) Field of Search ....................... 365/230.03, 230.04, 365/233, 236

(56) References Cited

U.S. PATENT DOCUMENTS

| | | | |
|---|---|---|---|
| 5,416,743 A | 5/1995 | Allan et al. .................. | 365/203 |
| 5,559,990 A | 9/1996 | Cheng et al. ................ | 395/484 |
| 5,663,924 A | 9/1997 | Barth, Jr. et al. ........ | 365/230.03 |
| 5,852,586 A | 12/1998 | Fujita .......................... | 365/233 |
| 5,892,730 A | 4/1999 | Sato et al. ................... | 365/233 |
| 5,920,511 A | 7/1999 | Lee et al. ............... | 365/189.05 |
| 5,939,913 A | 8/1999 | Tomita ........................ | 327/158 |
| 5,940,329 A | 8/1999 | Seitsinger et al. ...... | 365/189.05 |
| 5,973,991 A | 10/1999 | Tsuchida et al. ............ | 365/233 |
| 5,991,232 A | 11/1999 | Matsumura et al. ........ | 365/233 |
| 6,064,625 A | 5/2000 | Tomita ........................ | 365/233 |
| 6,191,997 B1 * | 2/2001 | Son ........................ | 365/230.04 |

OTHER PUBLICATIONS

"16Mb: x16 IT SDRAM, Synchronous DRAM MT48LC1M16A1 SIT", Micron Technology, Inc., 1999, pp. 1–50.
"16Mb: x16 SDRAM, Synchronous DRAM MT48LC1M16A1 S", Micron Technology, Inc., 1999, pp. 1–50.

* cited by examiner

*Primary Examiner*—A. Zarabian
(74) *Attorney, Agent, or Firm*—Skjerven Morrill MacPherson LLP; Michael Shenker (57) ABSTRACT

In a burst operation, a counter receives one or more bits of a starting column address. The count signal generated by the counter is provided to column decoders. The column decoders select two columns in response to a single value of the count signal. The two columns can be at non-consecutive column addresses. Alternatively, the two columns can be at consecutive column addresses starting at an odd column address boundary. Data are transferred between the two columns and a buffer in parallel. Data are transferred between the buffer and a data terminal serially. Some embodiments are suitable for burst operations defined by standards for synchronous dynamic random access memories.

27 Claims, 8 Drawing Sheets

BURST OPERATIONS IN MEMORIES

BACKGROUND OF THE INVENTION

1. Field of the Invention

This invention relates to memories, and more particularly to burst operations in memories.

2. Description of the Related Art

To improve memory data rates, some memories support burst operations. In a burst operation, multiple memory locations are accessed in response to a single starting address. At the beginning of a burst operation, a row address AX (FIG. 1) is delivered to X-decoders 14. X-decoders 14 select the corresponding row of memory cells in memory array 12. (In FIG. 1, rows are vertical, and columns are horizontal.) The row remains selected for the duration of the burst operation. The starting column address AY is delivered to column address counter 18. Counter 18 counts up by 1 starting from address AY on each cycle of clock signal CLK, and provides the count A to Y-decoders 16. This causes Y-decoders 16 to select consecutive columns, at consecutive column addresses A, in consecutive cycles of clock CLK. As a result, memory is accessed sequentially. The data D are transferred between the consecutive memory locations (i.e., memory locations at consecutive addresses) and an input/output (I/O) pad 30 at the frequency of clock CLK. The data rate is improved because the same memory row remains selected for multiple memory locations and because, therefore, the row decoding need not be done for each memory location.

Figure 1:
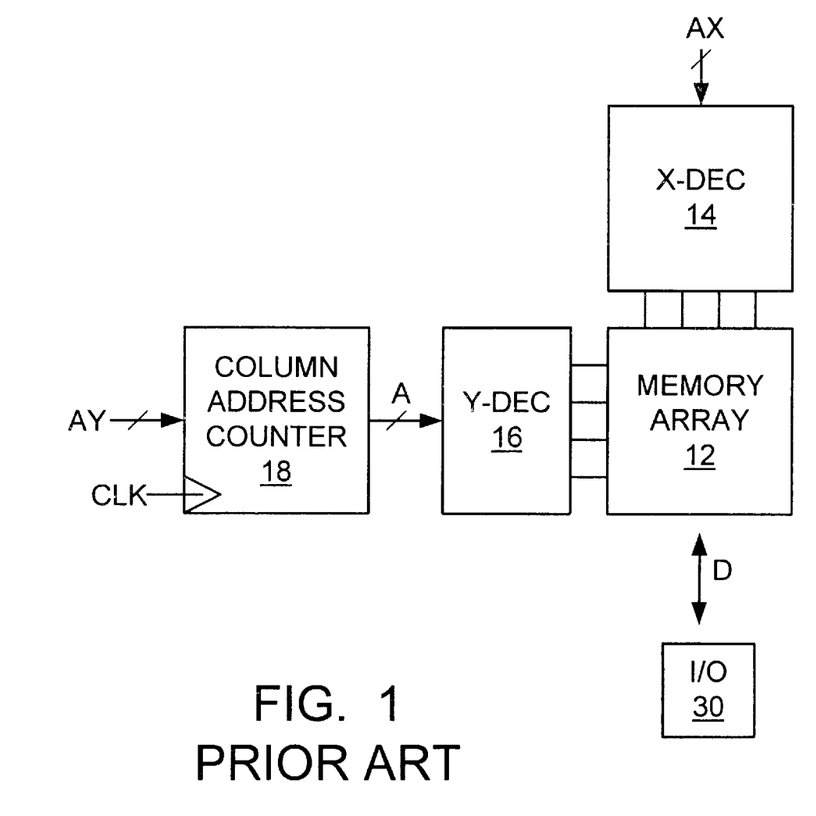
FIGS. 1 and 2 are block diagrams of prior art memories.

Disadvantageously, column address counter 18 operates at the same frequency as the data rate on I/O pad 30 (the frequency of clock CLK).

Figure 2:
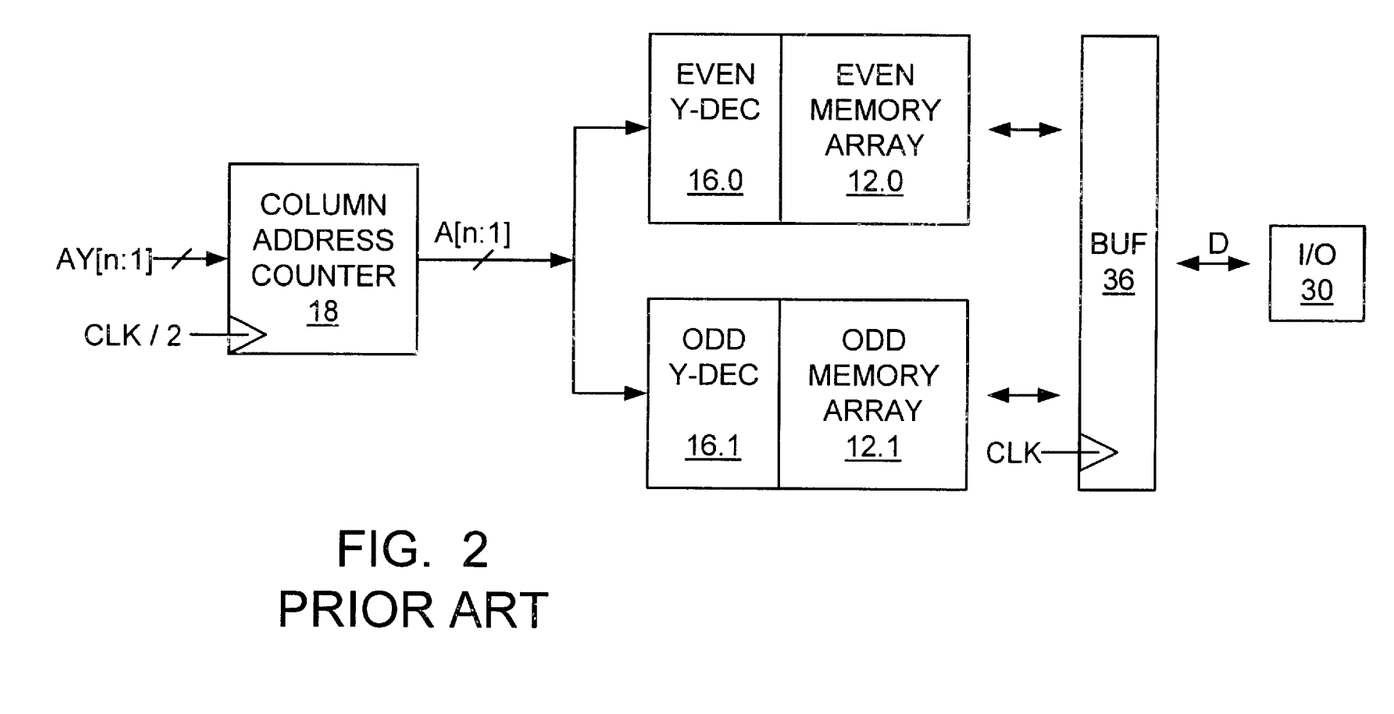

FIG. 2 shows a memory in which the column address counter 18 can operate at only half of the data rate on pad 30. The memory uses a two-bit prefetch technique known as "2n rule". The memory cells are arranged in two arrays 12.0, 12.1. Memory array 12.0 contains even memory locations (that is, memory locations at even column addresses; when a column address is even, the entire row-and-column address is even assuming the column address is the least significant portion of the entire address). Memory array 12.1 contains odd locations. In a burst operation, an even location in array 12.0 and an odd location in array 12.1 at consecutive addresses are accessed in parallel at one half of the frequency of clock CLK, and are transferred between the memory arrays and a buffer 36 at one half of the clock frequency. The data are transferred between buffer 36 and I/O pad 30 serially at the clock frequency.

The burst operation proceeds as follows. The row address (not shown) is supplied to both of the arrays 12.0, 12.1, to select one row in each array. Column address counter 18 receives the most significant bits AY[n:1] of the starting column address. The least significant bit AY[0] is not used by the counter. The counter counts up from AY[n:1] by 1 on every other clock cycle. The counter's output (count) signal A[n:1] is delivered to Y-decoder blocks 16.0, 16.1 of respective arrays 12.0, 12.1. Count bits A[n:1] are all but the least significant bit (LSB) of the column address.

Y-decoder blocks 16.0, 16.1 are identical. Y-decoder block 16.0 selects an even column. For this column, the column address LSB A[0]=0. Y-decoder block 16.1 select an odd column, corresponding to A[0]=1. As a result, two memory locations at column addresses <A[n:1],0>, <A[n:1], 1> are accessed in parallel at one half of the clock frequency, with the data transferred to or from buffer 36. The data are transferred between buffer 36 and I/O pad 30 serially at the clock frequency.

The 2n rule memory of FIG. 2 is not well suited for burst operations that access memory non-sequentially or not at an even address boundary. Examples of such burst operations are burst operations defined by standards for synchronous dynamic random access memories (SDRAMs) and described in Table 1 below. The sequence of memory locations accessed in each burst operation of Table 1 is determined by the burst length (2, 4, or 8), burst mode (sequential or interleaved), and the three last significant bits AY[2:0] of the starting column address. The burst length and mode can be programmed into the SDRAM's mode register (not shown) before a READ or WRITE command is issued to the SDRAM for the burst operation.

TABLE 1

| Burst Length | Starting Column Address LSBs AY[2:0] | Data Sequence: Sequential Mode | Data Sequence: Interleave Mode |
|---|---|---|---|
| 2 | xx0 | 0, 1 | 0, 1 |
|   | xx1 | 1, 0 | 1, 0 |
| 4 | x00 | 0, 1, 2, 3 | 0, 1, 2, 3 |
|   | x01 | 1, 2, 3, 0 | 1, 0, 3, 2 |
|   | x10 | 2, 3, 0, 1 | 2, 3, 0, 1 |
|   | x11 | 3, 0, 1, 2 | 3, 2, 1, 0 |
| 8 | 000 | 0, 1, 2, 3, 4, 5, 6, 7 | 0, 1, 2, 3, 4, 5, 6, 7 |
|   | 001 | 1, 2, 3, 4, 5, 6, 7, 0 | 1, 0, 3, 2, 5, 4, 7, 6 |
|   | 010 | 2, 3, 4, 5, 6, 7, 0, 1 | 2, 3, 0, 1, 6, 7, 4, 5 |
|   | 011 | 3, 4, 5, 6, 7, 0, 1, 2 | 3, 2, 1, 0, 7, 6, 5, 4 |
|   | 100 | 4, 5, 6, 7, 0, 1, 2, 3 | 4, 5, 6, 7, 0, 1, 2, 3 |
|   | 101 | 5, 6, 7, 0, 1, 2, 3, 4 | 5, 4, 7, 6, 1, 0, 3, 2 |
|   | 110 | 6, 7, 0, 1, 2, 3, 4, 5 | 6, 7, 4, 5, 2, 3, 0, 1 |
|   | 111 | 7, 0, 1, 2, 3, 4, 5, 6 | 7, 6, 5, 4, 3, 2, 1, 0 |

Columns 3 and 4 of Table 1 show the sequence in which the memory locations are accessed. For example, if the burst length is 4, the starting address is "x11" (i.e. AY[1:0]=11), and the mode is sequential, the locations are accessed in the order "3,0,1,2". This means the two LSBs A[1:0] of the accessed columns assume consecutively the values 3, 0, 1, 2 (binary 11, 00, 01, 10). The remaining column address bits A[n:2] are the same for each location, and are equal to the starting address bits AY[n:2]. For the burst length of 2, Table 1 provides the values of one LSB A[0] of the column address. The remaining column address bits A [n:1]=AY [n:1] remain the same for the burst operation. For the burst length of 8, Table 1 provides the values of the three LSBs A[2:0]. The other address bits A[n:3]=AY[n:3] remain the same.

Each burst operation defined by Table 1 performs access to a block of consecutive memory locations, but the memory locations within the block can be accessed non-sequentially. The 2n-rule memory of FIG. 2 cannot prefetch data for non-consecutive locations. In addition in Table 1, a pair of locations accessed sequentially can start at an odd address boundary. See for example the case of burst length=4, starting column address AY[2:0]=x01, sequential mode (locations 1,2 to be accessed sequentially start at an odd address boundary). In the memory of FIG. 2, locations can be accessed in prefetch (i.e., in parallel) only if they start at an even address boundary. Therefore, there is a need for an alternative prefetch memory architecture that allows prefetches for non-consecutive memory locations and for locations starting at an odd boundary while allowing the address generation logic to operate at a lower rate than the data rate on the external input or output terminals (such as I/O pad 30).

Allowing the address generation logic to operate at a lower rate is particularly desirable in double data rate (DDR) SDRAMs which have emerged as a higher bandwidth memory solution than conventional SDRAMs. In DDR SDRAMs, data are provided on the external terminals on both the rising and falling clock edges. Thus, the data transfer rate is doubled. Address generation logic that can operate at a lower frequency is therefore particularly desirable.

SUMMARY

In some embodiments of the present invention, a prefetch can be performed for non-consecutive memory locations and/or memory locations starting at an odd address boundary. In some embodiments, column decoder circuitry receives a count signal from a counter and selects at least two columns of memory cells in response to each value of the count signal. The count signal does not necessarily represent address bits. The two columns selected by their column decoder satisfy at least one of the following conditions (A) and (B):

(A) the two columns have non-consecutive column addresses;

(B) the two columns have consecutive column addresses starting at an odd column address boundary.

In some embodiments, a memory of the present invention comprises first column decoder circuitry for selecting an even column, and second column decoder circuitry for selecting an odd column. The first column decoder circuitry is not identical to the second column decoder circuitry. In a burst operation, the first column decoder circuitry and the second column decoder circuitry select an even column and an odd column at the same time. The even and odd columns satisfy at least of the above conditions (A) and (B).

Other features and advantages of the invention are described below. The invention is defined by the appended claims.

DESCRIPTION OF PREFERRED EMBODIMENTS

Figure 3:
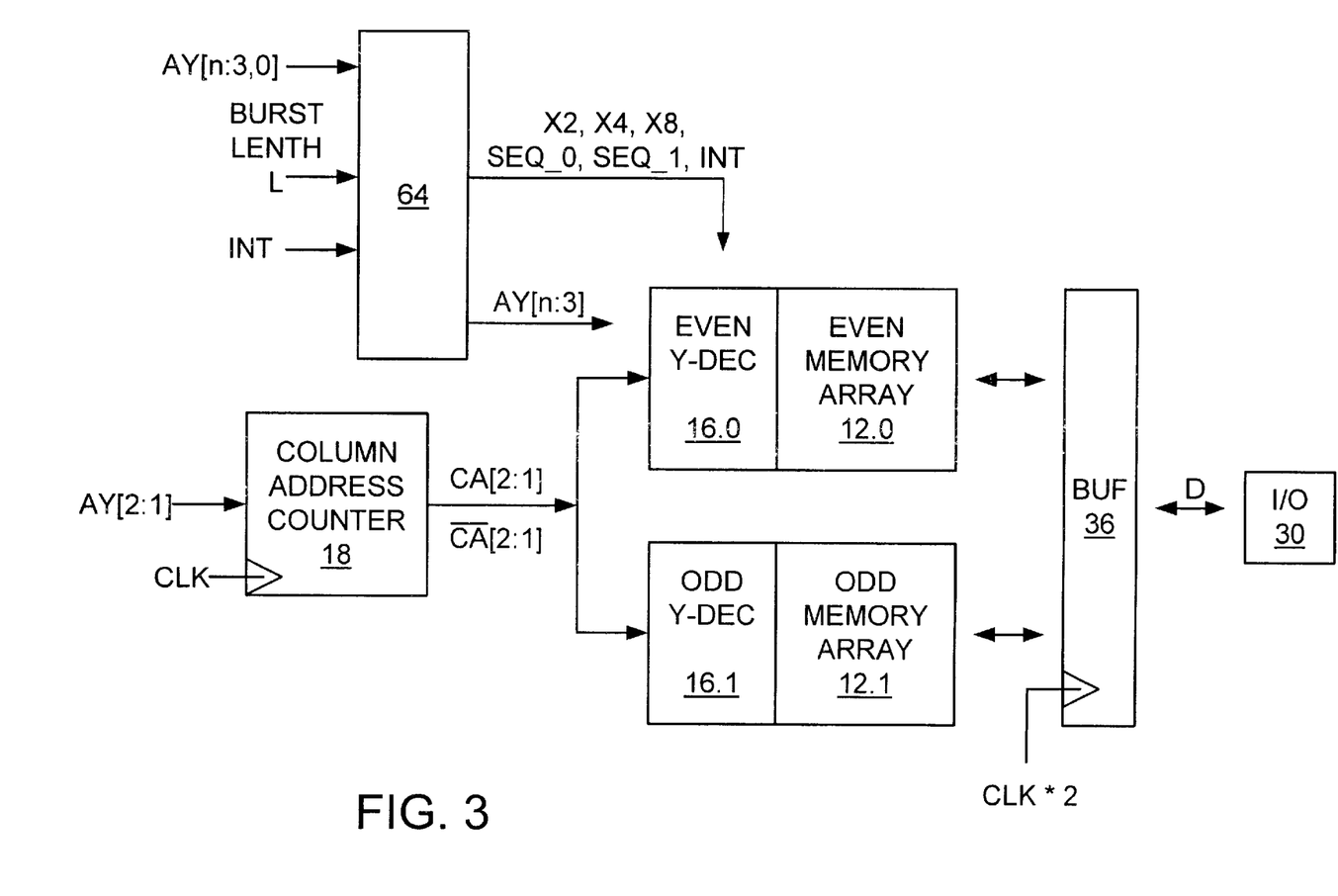
FIG. 3 is a block diagram of a memory according to the present invention.

FIG. 3 illustrates a memory capable to perform two-bit prefetches suitable for the burst operations of Table 1. Non-consecutive memory locations, and memory locations starting at an odd address boundary, can be accessed in parallel. For example, for a burst length of 4, starting address "x 11", sequential mode, the locations "3,0" are accessed in parallel, and then the locations "1,2" are accessed in parallel. Similarly, for a burst length of 8, starting address "111", sequential mode, each pair of locations "7,0", "1,2", "3,4", "5,6" is accessed in parallel.

The memory of FIG. 3 operates at the double data rate (DDR). Hence, the data bits appear on I/O pad 30 at the frequency CLK*2. Counter 18 operates at half of that rate, counting up by 1 in each cycle of clock CLK. In other embodiments, the memory operates at a single data rate, or some other data rate, with counter 18 operating at half of the data rate on the I/O pad.

The memory of FIG. 3 contains even memory array 12.0 and odd memory array 12.1. Each memory array has row decoders (X-decoders), not shown, which select one row in each array at a row address AX for the duration of a burst operation, as in the memory of FIG. 2. I/O pad 30 is connected to buffer 36, as in FIG. 2. Buffer 36 and I/O pad 30 of FIG. 3 are similar to buffer 36 and I/O pad 30 of FIG. 2 (except that the buffer 36 transfers data to and from I/O pad 30 at the frequency CLK*2).

The even Y-decoder block 16.0 selects a column in memory array 12.0. Odd Y-decoder block 16.1 selects a column in memory array 12.1. Y-decoder blocks 16.0, 16.1 are not identical.

Counter 18 receives starting column address bits AY[2:1], and counts up by 1 (modulo 4). The counter output signal CA[2:1] and its complement $\overline{CA[2:1]}$ are provided to the Y-decoders. This count signal CA[2:1] does not necessarily represent column address bits A[2:1] of columns selected by the Y-decoders.

Logic block 64 receives starting column address bits AY[n:3,0], the burst length L, and a sequential/interleave mode flag INT. Logic 64 generates the following signals for Y-decoders 16.0, 16.1:

X2 (high when the burst length is 2);

X4 (high when the burst length is 4);

X8 (high when the burst length is 8);

SEQ_0 (high indicates the mode is sequential and the starting column address is even, that is, AY[0]=0);

SEQ_1 (sequential mode, starting column address is odd, that is, AY[0]=1);

INT (high indicates interleave mode);

AY[n:3].

Y-decoder blocks 16.0, 16.1 can be combinational circuits designed to select columns according to Table 1 when the first pair of columns in a burst operation is to be selected. At that time, CA[2:1]=AY[2:1]. For reasons explained below, the Y-coders can be designed without taking into account the column selection in subsequent cycles of a burst operation. The columns selected by the Y-decoders are shown in Table 2 below. Like Table 1, Table 2 shows only the LSBs of the selected columns. For the burst length of 2, only one LSB is shown (value of 0 or 1). For the burst length of 4, two LSBs are shown. For the burst length of 8 three LSBs are shown. Table 2 corresponds to Table 1. For example, suppose the burst length is 4, starting address AY[2:0]=011, and the mode is sequential. Then for the first two columns CA[2:1]= 01 and AY[0]=1. According to Table 2, the Y-decoders select the columns (3,0), as prescribed by Table 1.

TABLE 2

| | | Sequential Mode | | Interleave Mode | |
|---|---|---|---|---|---|
| Burst Length | CA[2:1], AY[0] | Y-decoder 16.0 selects | Y-decoder 16.1 selects | Y-decoder 16.0 selects | Y-decoder 16.1 selects |
| 2 | xx0 | 0 | 1 | 0 | 1 |
|   | xx1 | 0 | 1 | 0 | 1 |
| 4 | x00 | 0 | 1 | 0 | 1 |
|   | x01 | 2 | 1 | 0 | 1 |
|   | x10 | 2 | 3 | 2 | 3 |
|   | x11 | 0 | 3 | 2 | 3 |

TABLE 2-continued

| Burst Length | CA[2:1], AY[0] | Sequential Mode | | Interleave Mode | |
|---|---|---|---|---|---|
| | | Y-decoder 16.0 selects | Y-decoder 16.1 selects | Y-decoder 16.0 selects | Y-decoder 16.1 selects |
| 8 | 000 | 0 | 1 | 0 | 1 |
| | 001 | 2 | 1 | 0 | 1 |
| | 010 | 2 | 3 | 2 | 3 |
| | 011 | 4 | 3 | 2 | 3 |
| | 100 | 4 | 5 | 4 | 5 |
| | 101 | 6 | 5 | 4 | 5 |
| | 110 | 6 | 7 | 6 | 7 |
| | 111 | 0 | 7 | 6 | 7 |

Since Y-decoders 16.0, 16.1 are combinational circuits, they operate according to Table 2 throughout the burst operation and not only when the first two columns are accessed, i.e., not only when CA[2:1]=AY[2:1]. Yet the Y-decoders always select correct columns in accordance with Table 1. To understand why this is so, let us consider an example of the burst length of 4, starting column address AY[2:0]=001, sequential mode. (In this discussion, we ignore the address bits other than AY[2:0] since the other address bits are fixed for the entire burst operation.) As shown in Table 1, at first the columns (1,2) must be selected, and in the next clock cycle, columns (3,0) must be selected. For the first two columns, <CA[2:1],AY[0]>=001, so the Y-decoders select columns (1,2) as shown in Table 2.

In the next clock cycle, CA[2:1] is incremented from 00 to 01, so <CA[2:1],AY[0>]=011. According to Table 2, for the burst length of 4 and <CA[2:1],AY[0>=011, sequential mode, the Y-decoders 16.0, 16.1 select columns (3,0). These are exactly the columns that must be selected as the second column pair for the burst length of 4, starting address 001, according to Table 1.

In another example, consider the case of the burst length of 8, starting address 111, sequential mode. In four consecutive clock cycles, the following respective column pairs must be selected according to Table 1: (7,0), (1,2), (3,4), (5,6). In the first of these cycles, the pair (7,0) will be selected according to Table 2. In the next three cycles, bits CA[2:1] will be incremented by 1. Hence, the three-bit number <CA[2:1],AY[0]>will be incremented by 2 and will assume the values 001, 011, 101. According to Table 2, the Y-decoders will select columns (1,2), (3,4), (5,6), as prescribed by Table 1.

Examination of Tables 1 and 2 shows that the memory of FIG. 3 will operate correctly for all of the burst operations of Table 1.

Figure 4:
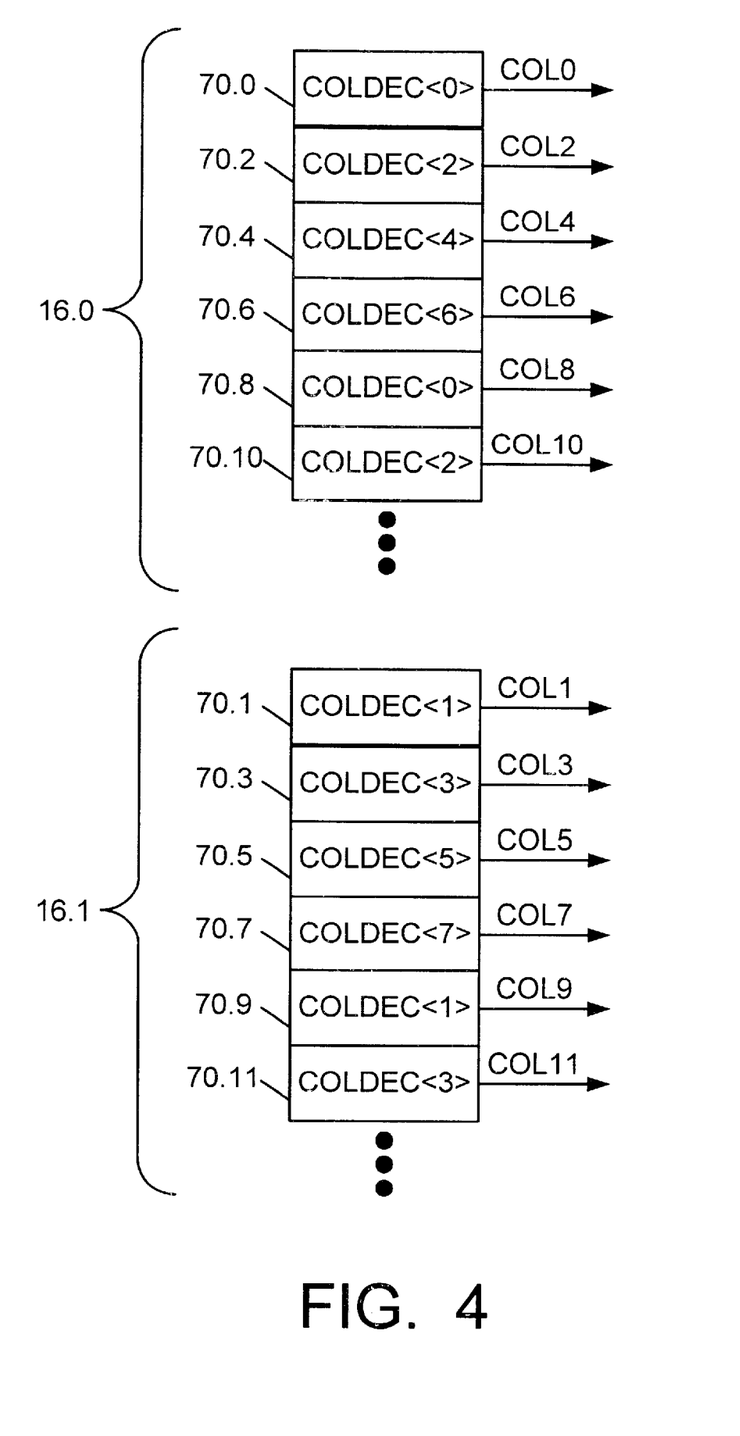
FIG. 4 is a block diagram of a column decoder circuit of the memory of FIG. 3.

We will now describe one memory embodiment in detail. Y-decoder block 16.0 includes column decoders 70.0, 70.2, 70.4, . . . (FIG. 4). Each of these decoders selects the respective column 0, 2, 4, . . . Similarly, Y-decoder block 16.1 includes column decoders 70.1, 70,3, 70.5, . . . which select respective columns, 1, 3, 5, . . .

Y-decoder block 16.1 can be identical to prior art Y-decoder block 16.1 of FIG. 2.

In FIG. 4, decoders 70.0 and 70.8 have similar construction, of type shown as COLDEC<0>in FIG. 4. All of the decoders for columns 0, 8, 16, 24, . . . have the construction which will be denoted COLDEC<0>and described below with respect to FIG. 5*a*. Similarly, the decoders for columns 1, 9, 17, 25, . . . have the same construction, shown as COLDEC<1>(FIG. 5*e*). The decoders for columns 2, 10, 18, 26, . . . have similar construction, shown as COLDEC<2>(FIG. 5*b*). The decoders for columns 3, 11, 19, 27, . . . have similar construction, shown as COLDEC<3>(FIG. 5*f*). The decoders for columns 4, 12, 20, . . . have similar construction, shown as COLDEC<4> (FIG. 5*c*). The decoders for columns 5, 13, 21, . . . have similar construction, shown as COLDEC<5>(FIG. 5*g*). The decoders for columns 6, 14, 22, . . . have similar construction, shown as COLDEC<6>(FIG. 5*d*). The decoders for columns 7, 15, 23, . . . have similar construction, shown as COLDEC<7>(FIG. 5*h*).

In FIGS. 5*a*–5*h*, the signal CA[1] is denoted as CA1, CA[2] as CA2. $\overline{CA1}$ and $\overline{CA2}$ are compliments of CA1 and CA2 respectively. The compliments are generated by counter 18 (FIG. 3).

Each of the decoders 70.0, 70.1, 70.2 . . . generates signals ADn, . . . AD3 from signals AY[n:3]. In each decoder 70.i, signals ADn, . . . AD3 in decoder 70.i are all 1's when column i is being selected. More particularly, let A[n:0] be the binary representation of i, that is, i=A[n:0]. Then for each k≧3 signal ADk is generated as follows:

If A[k]=1, then ADk≦AY[k];
If A[k]=0, then ADk=AY[k].

The signals ADn, . . . AD3 are generated by conventional circuitry (not shown) in each decoder.

Column decoder COLDEC<0>(FIG. 5*a*) includes: an OR gate 201 having three input terminals receiving respective signals INT, SEQ_0, and X2; an AND gate 202 having four input terminals receiving respective signals CA1, $\overline{CA2}$, X4, and SEQ_1; an AND gate 203 having four input terminals receiving respective signals CA1, CA2, X8, and SEQ_1; an AND gate 204 having a first input terminal connected to the output terminal of OR gate 201, and a second and a third input terminals receiving respective signals $\overline{CA1}$ and $\overline{CA2}$; an OR gate 205 having two input terminals connected to the respective output terminals of AND gates 202 and 203; an OR gate 206 having two input terminals connected to the respective output terminals of gates 204 and 205; and an AND gate 207 having n–1 input terminals and an output terminal for providing the column select signal (e.g. COL0 for decoder 70.0), one of the n–1 input terminals being connected to the output terminal of OR gate 206, and the rest receiving respective signals AD3, . . . ADn.

Column decoder COLDEC<2>(FIG. 5*b*) includes: an OR gate 208 having three input terminals receiving respective signals INT, SEQ_0, and X2; an AND gate 209 having three input terminals receiving respective signals $\overline{CA1}$, $\overline{CA2}$, and SEQ_1; an AND gate 210 having a first input terminal connected to the output terminal of OR gate 208, and a second and a third input terminals receiving respective signals CA1 and $\overline{CA2}$; an OR gate 211 having two input terminals connected to the respective output terminals of AND gates 209 and 210; and an AND gate 212 having n–1 input terminals and an output terminal for providing the column select signal, one of the n–1 input terminals being connected to the output terminal of OR gate 211, and the rest receiving respective address signals AD3, . . . , ADn.

Figure 5A:
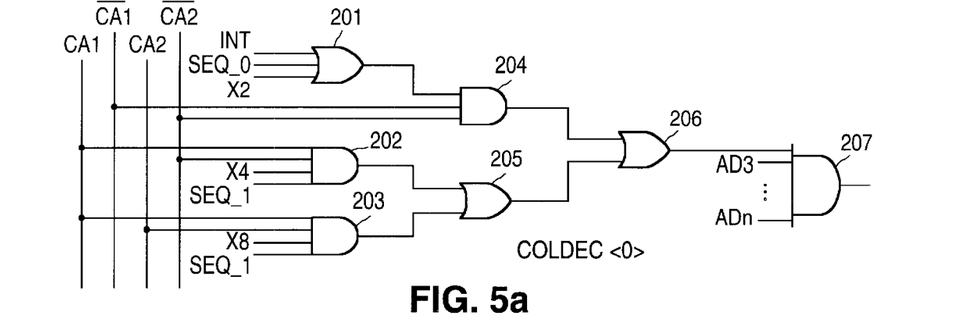
FIGS. 5a–5h are circuit diagrams of column decoders of the memory of FIG. 3.
Figure 5B:
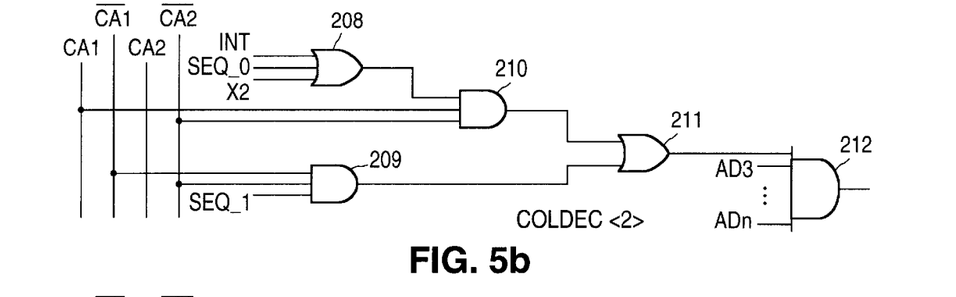
Figure 5C:
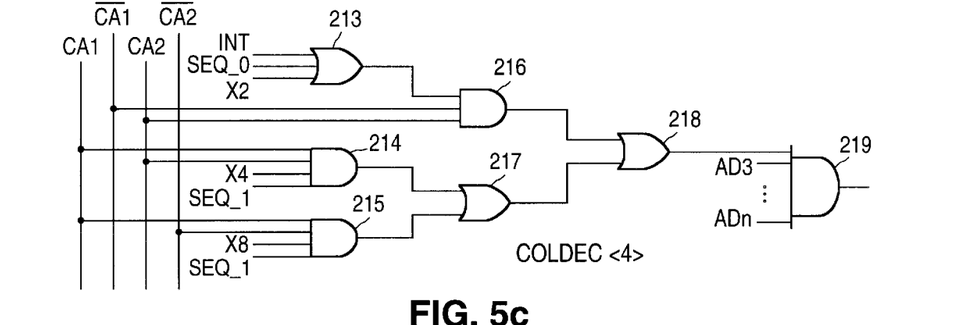
Figure 5D:
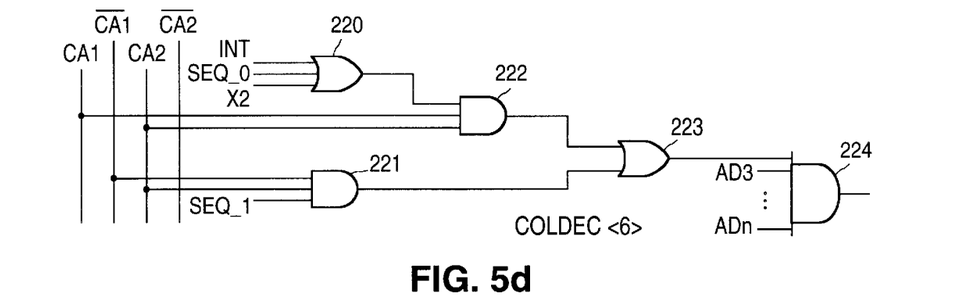
Figure 5E:
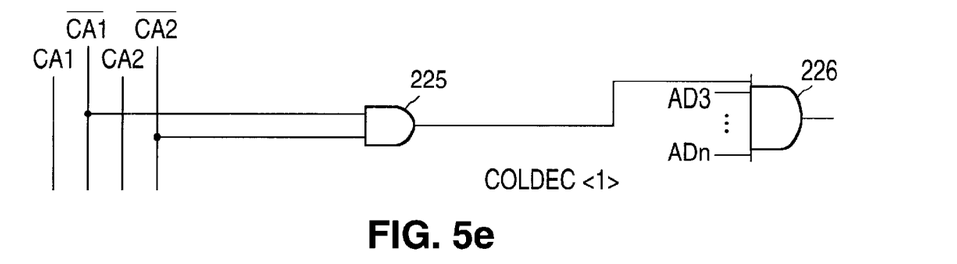
Figure 5F:
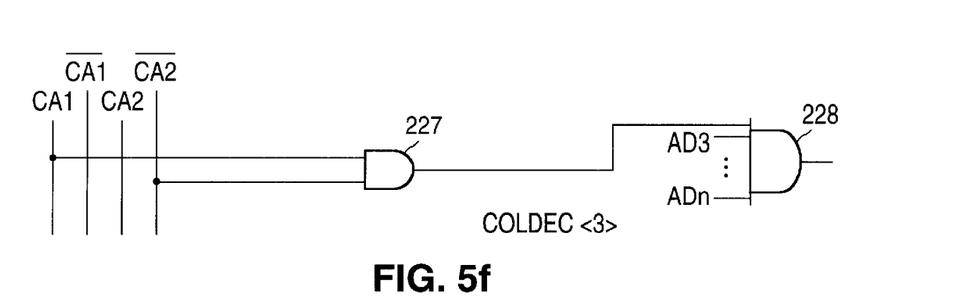
Figure 5G:
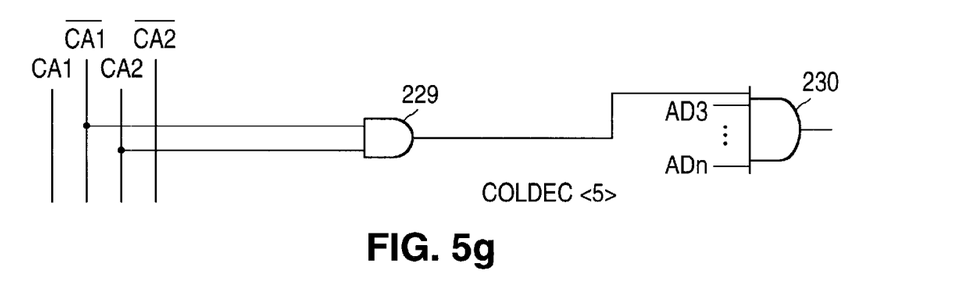
Figure 5H:
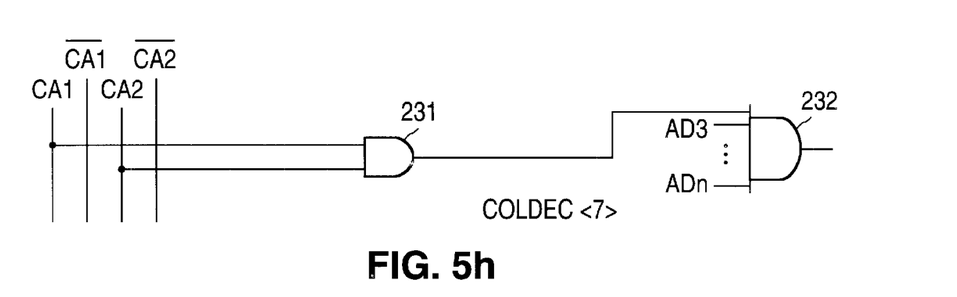

Column decoder COLDEC<4>(FIG. 5*c*) includes gates 213, 214, 215, 216, 217, 218, and 219 which are identical to gates 201, 202, 203, 204, 205, 206, and 207 respectively of FIG. 5*a*, and are interconnected identically, except that in FIG. 5*c* the AND gate 214 receives signal CA2 instead of $\overline{CA2}$, the AND gate 215 receives signal $\overline{CA2}$ instead of CA2, and the AND gate 216 receives signal CA2 instead of $\overline{CA2}$. (Of course, the signals ADn . . . AD3 are also different for decoders that decode columns having non identical column address bits A[n:3]).

Column decoder COLDEC<6>(FIG. 5*d*) includes gates 220, 221, 222, 223, and 224 which are identical to gates 208, 209, 210, 211, and 212 respectively of FIG. 5b, and are interconnected identically, except that in FIG. 5d the AND gate 221 receives signal CA2 instead of fheightCA2, and the AND gate 222 receives signal CA2 instead of fheightCA2.

Column decoder COLDEC<1>(FIG. 5e) includes: an AND gate 225 having two input terminals receiving signals fheightCA1 and fheightCA2; and an AND gate 226 having n–1 input terminals and an output terminal for providing the column select signal, one of the n–1 input terminals being connected to the output terminal of AND gate 225, and the rest receiving respective address signals AD3, . . . ADn.

Each of column decoders COLDEC<3>, COLDEC<5>, and COLDEC<7> of the respective FIGS. 5f, 5g, and 5h is identical to column decoder COLDEC<1> of FIG. 5e except that: COLDEC<3> of FIG. 5f (gates 227, 228) receives signals CA1 and fheightCA2 instead of fheightCA1 and fheightCA2; COLDEC<5> of FIG. 5g (gates 229, 230) receives signals fheightCA1 and fheightCA2 instead of fheightCA1 and fheightCA2; and COLDEC<7> of FIG. 5h (gates 231, 232) receives signals CA1 and CA2 instead of fheightCA1 and fheightCA2.

Figure 6A:
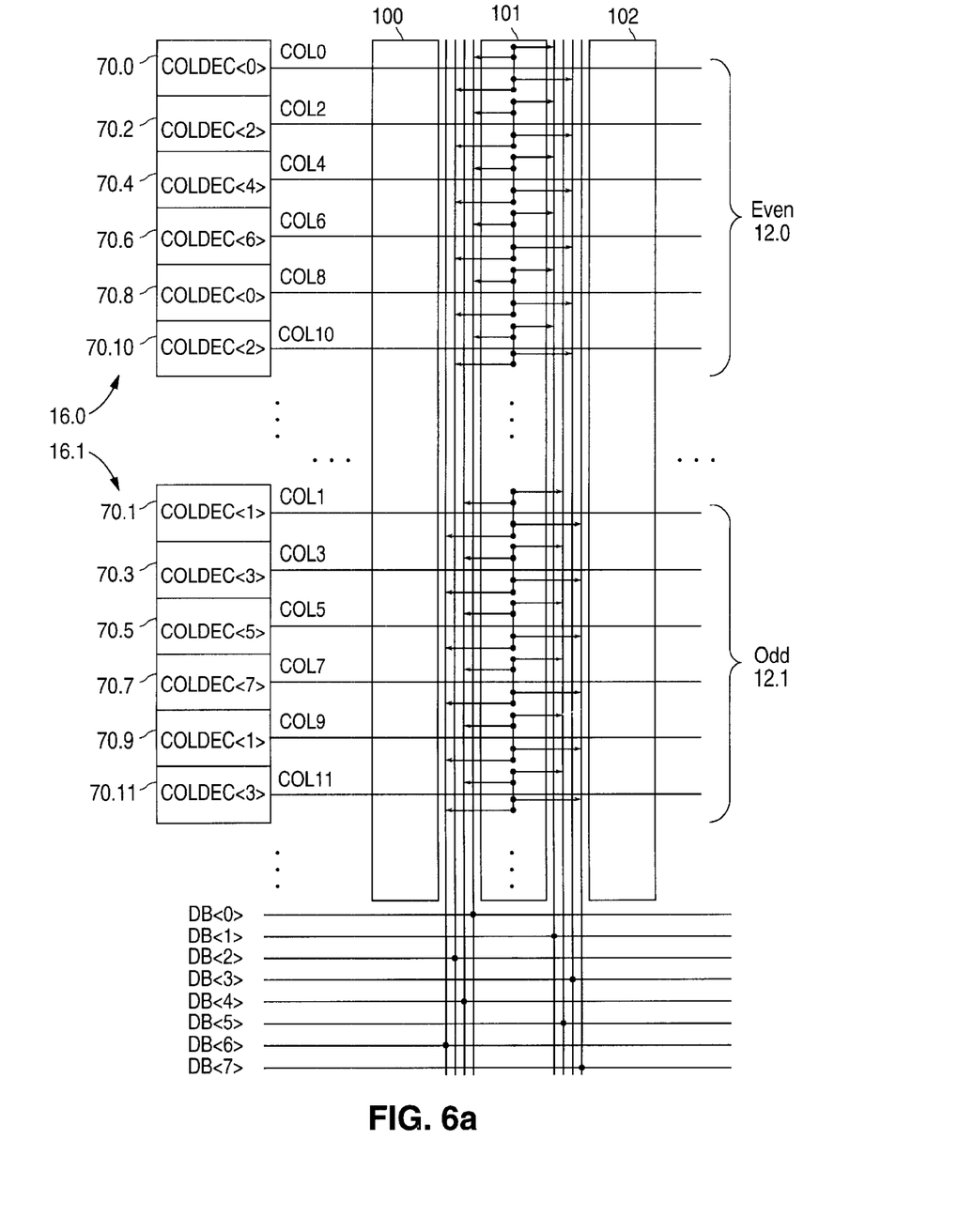
FIGS. 6a and 6b are a block diagram of a memory in accordance with one embodiment of the present invention.
Figure 6B:
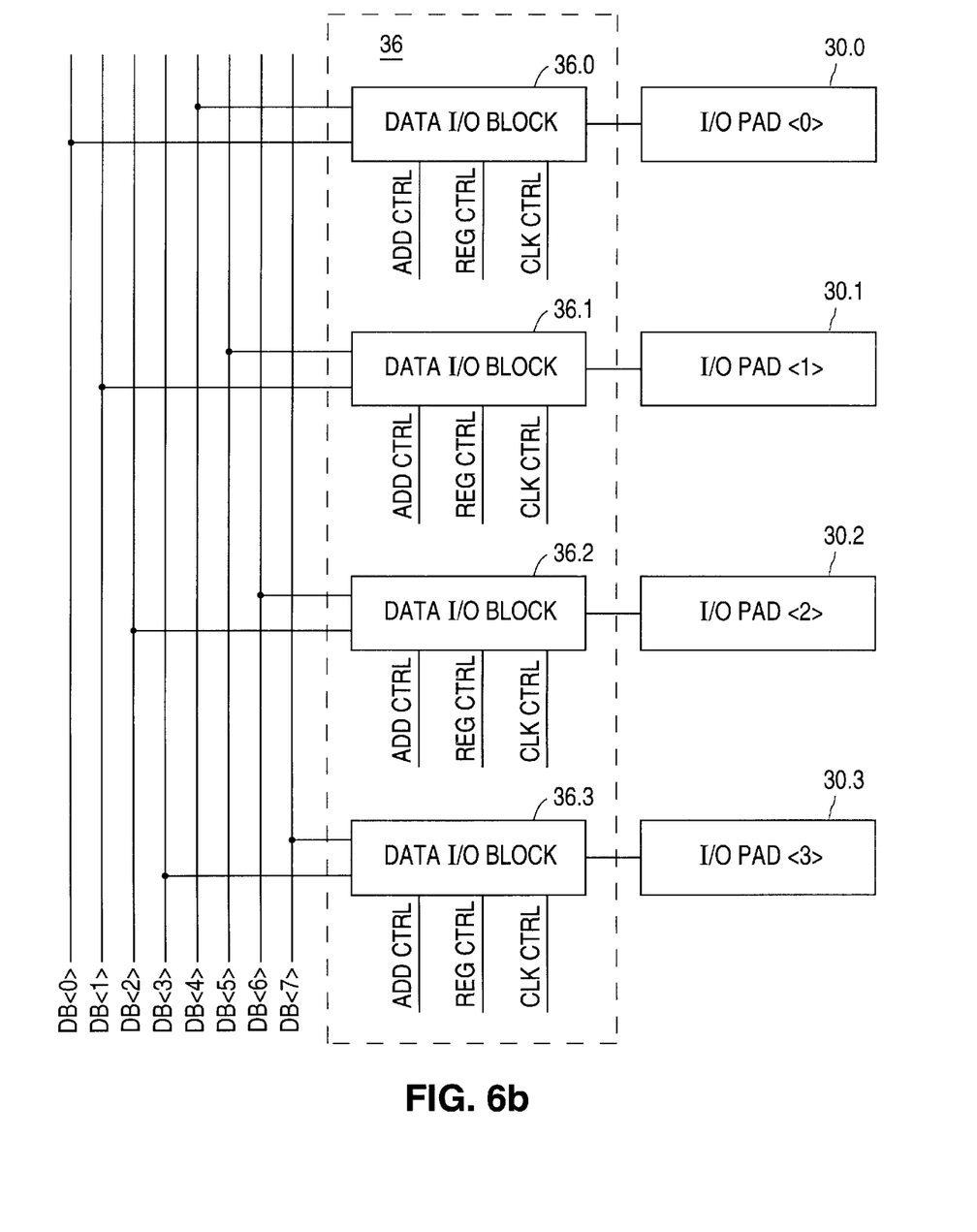

FIGS. 6a and 6b show another memory circuit according to one embodiment of the present invention. The circuit of FIGS. 6a and 6b is a portion of an SDRAM device having a by-four output configuration (i.e., four I/O pads).

The memory includes DRAM cell array sections 100, 101, 102. Each array section includes a plurality of rows and columns of DRAM cells (not shown). Data bus lines DB<0>, DB<2>, DB<4>, and DB<6> run between array sections 101 and 102. Data bus lines DB<1>, DB<3>, DB<5>, and DB<7> run between sections 100 and 101. Each array section 100, 101, 102 includes an odd portion 12.1 (bottom half in FIG. 6a) and an even portion 12.0 (top half in FIG. 6a). The even portion 120 of each array section includes even numbered columns 0, 2, 4, . . . The odd portion 12.1 of each array section includes odd numbered columns 1, 3, 5, . . . The sections 100, 101, 102 share the column decoders 16.0, 16.1. Decoders 16.0, 16.1 are as in FIGS. 4, 5a–5h.

Other memory sections (not shown) can be present, organized as sections 100, 101, 102, possibly with their own column decoders.

The even and odd portions 12.0, 12.1 of each section may share row decoders (not shown). Alternatively, separate row decoders may be provided for the even and odd portions.

The memory of FIGS. 6a, 6b includes counter 18 and logic 64 (FIG. 3), not shown in FIGS. 6a, 6b. Counter 18 receives the starting address bits AY[2:1].

In FIG. 6b, blocks 36.0, 36.1, 36.2, 36.3 form buffer 36 (FIG. 3). Blocks 36.0, 36.1, 36.2, 36.3 are connected to I/O pads 30.0, 30.1, 30.2, 30.3 respectively. Each of I/O blocks 36 has three control input terminals receiving respective signal CLK CTRL, REG CTRL, and ADD CTRL. The ADD CTRL signal indicates whether the starting address is odd or even, the REG CTRL signal indicates the programmed CAS latency (programmed into the mode register, not shown), and the CLK CTRL signal, which is derived from an external clock, clocks the data transfers through the Data I/O blocks.

I/O block 36.0 is connected to lines DB<0> and DB<4>. I/O block 36.1 is connected to lines DB<1> and DB<5>. I/O block 36.2 is connected to lines DB<2> and DB<6>. I/O block 36.3 is connected to lines DB<3> and DB<7>.

In a burst operation, one column from the odd portion 12.1 and one column from the even portion 12.0 and one row are selected. The selected row and the selected odd column cause four data bits to be simultaneously transferred between a four-memory-cell storage unit in the odd portion 12.1 and data bus lines DB<0>–DB<3>. At the same time, the selected row and the selected even column cause four data bits to be simultaneously transferred between a four-memory-cell storage unit in the even portion 12.0 and data bus lines DB<4>–DB<7>. Data I/O blocks 36 (FIG. 6b) store the two sets of four data bits and serially transfer the bits to I/O pads 30 in a read access, and in the opposite direction in a write access.

Data I/O blocks 36 transfer the two sets of four data bits to the I/O pads (in a read access) or from the I/O pads (in a write access) in accordance with the state of control signals CLK CTRL, REG CTRL, and ADD CTRL.

In a read access, if the starting address is odd, the four data bits from the selected odd column are simultaneously transferred from blocks 36 to the corresponding I/O pads on a rising edge of a clock cycle, and the four data items from the selected even column are simultaneously transferred from blocks 36 to the corresponding I/O pads on the following falling clock edge.

Similarly, in a write access, if the starting address is odd, four data bits are simultaneously transferred from the four I/O pads to the corresponding blocks 36 on a rising edge of a clock cycle, and four data bits are simultaneously transferred from the four I/O pads to the corresponding blocks 36 on the following falling clock edge. The timing of the data transfers between the Data I/O blocks 36 and data bus lines DB<0>–DB<7> is in accordance with the programmed CAS latency.

As an example, in the interleave mode, with a burst length of 8, and a starting address AY[2:0] of 011 (an odd address), the columns must be accessed in the following order: 3,2,1,0,7,6,5,4.

Suppose the section being accessed in a read access is section 101 (as determined by the row address). In the first array access, columns 3 and 2 in section 101 are selected simultaneously (i.e., the 3 LSBs of the column address are 011 and 010). Four data bits corresponding to column 3 are thus transferred from the odd portion of section 101 to the respective data bus lines DB<4>–DB<7>, and simultaneously four data items corresponding to column 2 are transferred from the even portion of section 101 to respective data bus lines DB<0>–DB<3>. With ADD CTRL signal indicating an odd starting address, data I/O blocks 36 transfer the data bits received on lines DB<4>–DB<7> to the corresponding I/O pads 30 upon a rising edge of a clock cycle, and transfer the data bits received on lines DB<0>–DB<3> to the I/O pads on the following falling clock edge.

In the next memory access, columns 1 and 0 are simultaneously selected (in the same selected row in section 101). Four data bits corresponding to column 1 and four data bits corresponding to column 0 are simultaneously transferred from the respective odd and even portions of section 101 to respective data bus lines DB<4>–DB<7> and DB<0>–DB<3>. Data I/O blocks 36 then transfer the data bits received on lines DB<0>–DB<7> to I/O pads 30 on the rising and falling edges of a clock cycle, as described above.

The above description of the present invention is illustrative and not limiting. The invention is not limited to any particular burst lengths or output configurations. For example, the invention is applicable to by-eight and by-sixteen output configurations. The invention is not limited to the particular logic of FIGS. 5a–5h or any other circuitry. The invention is not limited to the number of memory arrays. Some embodiments include only one array. The invention is not limited to any particular signals generated by logic 64 or to decoder blocks 16.0, 16.1 being combinational circuits. The invention is not limited to the counter 18 counting up. The counter may count down. Further, the counter may count by 2 or some other number rather than 1. The invention is not limited to a counter starting the count from AY[2:1]. The invention includes all the variations and modifications falling within the scope of the appended claims.

What is claimed is:

1. A memory comprising:
   a plurality of columns of memory storage units, each memory storage unit comprising one or more memory cells;
   a counter for receiving a signal indicative of a starting address of a burst operation, and for providing a count signal during the burst operation;
   column decoder circuitry for receiving the count signal and selecting at least two columns of the memory cells in response to a single value of the count signal, wherein for at least one burst operation and at least one value of the count signal, two columns selected by the column decoder circuitry satisfy at least one of the following conditions (A) and (B):
   (A) the two columns have non-consecutive column addresses;
   (B) the two columns have consecutive column addresses starting at an odd column address boundary.

2. The memory of claim 1, wherein in at least one burst operation, in response to at least one value of the count signal, the column decoder circuitry is to select two columns satisfying the condition (A), and in at least one burst operation, in response to at least one value of the count signal, the column decoder circuitry is to select two columns satisfying the condition (B).

3. The memory of claim 1 further comprising:
   a first circuit for receiving data from the storage units and providing data to the storage units, wherein data are transferred in parallel between (a) two columns selected by the column decoder circuitry in response to a single value of the count signal, and (b) the first circuit; and
   a data terminal, wherein data bits written to or read from the two columns in parallel are transferred consecutively between the data terminal and the first circuit.

4. The memory of claim 1, wherein for each burst operation of Table 1 having a burst length of 4, when four columns C1, C2, C3, C4 are to be accessed in the order recited, the column decoder circuitry selects columns C1 and C2 in response to a single value of the count signal, and selects columns C3 and C4 in response to a single value of the count signal.

5. The memory of claim 1, wherein for each burst operation of Table 1 having a burst length of 8, when eight columns C1, C2, C3, C4, C5, C6, C7, C8 are to be accessed in the order recited, the column decoder circuitry selects columns C1 and C2 in response to a single value of the count signal, selects columns C3 and C4 in response to a single value of the count signal, selects columns C5 and C6 in response to a single value of the count signal, and selects columns C7 and C8 in response to a single value of the count signal.

6. The memory of claim 1, wherein the memory is a synchronous dynamic random access memory.

7. The memory of claim 6 further comprising a data terminal for accessing the memory, wherein data bits written to or read from the two columns in parallel are transferred serially via the data terminal in the burst operation;
   wherein the memory is a double data rate memory, with the counter operating at one half of a frequency of data appearing on the data terminal in the burst operation.

8. The memory of claim 1 wherein the column decoder circuitry is combinational circuitry.

9. A method for accessing a memory in a burst operation, the method comprising:
   receiving a starting address for a burst operation;
   counting from a value represented by at least a portion of the starting address, and providing a count signal;
   in response to a value of the count signal, selecting at least two columns of memory storage units for accessing a storage unit in each of the columns, wherein the two columns satisfy at least one of the following conditions (A) and (B):
   (A) the two columns have non-consecutive column addresses;
   (B) the two columns have consecutive column addresses starting at an odd column address boundary.

10. The method of claim 9, wherein in response to at least one value of the count signal, the column decoder circuitry selects two columns satisfying the condition (A), and in response to at least one other value of the count signal, the column decoder circuitry selects two columns satisfying the condition (B).

11. The method of claim 9 further comprising:
    a first circuit receiving at least two data bits in parallel from the two columns or providing at least two data bits in parallel to the two columns; and
    serially transferring the two data bits between a data terminal and the first circuit.

12. The method of claim 9, wherein the burst operation is one of the operations of Table 1 having a burst length of 4, sequential mode, and the least significant starting column address bit AY[0] equal to 1; and
    when four columns C1, C2, C3, C4 are accessed in the order recited, then the columns C1 and C2 are selected in response to a single value of the count signal, and columns C3 and C4 are selected in response to another single value of the count signal.

13. The method of claim 9, wherein the burst operation is one of the operations of Table 1 having a burst length of 8, sequential mode, and the least significant starting column address bit AY[0] equala to 1; and
    when eight columns C1, C2, C3, C4, CS, C6, C7, C8 are accessed in the order recited, the columns C1 and C2 are selected in response to a single value of the count signal, columns C3 and C4 are selected in response to a single value of the count signal, columns C5 and C6 are selected in response to a single value of the count signal, and columns C7 and C8 are selected in response to a single value of the count signal.

14. The method of claim 9 wherein the memory is a synchronous dynamic random access memory.

15. The method of claim 14 wherein the memory comprises a data terminal for accessing the memory, wherein data bits written to or read from the two columns in parallel are transferred serially via the data terminal in the burst operation;
    wherein the memory is a double data rate memory, with the counting being performed at one half of a frequency of data appearing on the data terminal in the burst operation.

16. A memory comprising:

a plurality of columns of memory storage units, each memory storage unit comprising one or more memory cells;

first column decoder circuitry for selecting even columns (i.e. columns at even column addresses) from said plurality of columns;

second column decoder circuitry for selecting odd columns (i.e. columns at odd column addresses) from said plurality of columns, wherein the second column decoder circuitry is not identical to the first column decoder circuitry; and a circuit for causing the first column decoder circuitry to select an even column in a burst operation and, at the same time, for causing the second column decoder circuitry to select an odd column in the burst operation, wherein the even and odd columns selected at the same time satisfy at least one of the following conditions (A) and (B):
 (A) the even and odd columns have non-consecutive column addresses;
 (B) the even and odd columns have consecutive column addresses starting at an odd column address boundary.

17. The memory of claim 16 wherein the first column decoder circuitry and the second column decoder circuitry are operable to select, at the same time, an even column and an odd column that satisfy the condition (A), and are operable to select, at the same time, an even column and an odd column that satisfy the condition (B).

18. The memory of claim 16 further comprising:

a first circuit for receiving data bits from the storage units and providing data bits to the storage units, wherein data bits are transferred in parallel between (a) two columns selected at the same time by the first column decoder circuitry and the second column decoder circuitry, and (b) the first circuit; and a data terminal, wherein data bits transferred in parallel between the two columns and the first circuit are transferred consecutively between the data terminal and the first circuit.

19. The memory of claim 16 wherein for each burst operation of Table 1 having a burst length of 4, when four columns C1, C2, C3, C4 are to be accessed in the order recited, the first column decoder circuitry and the second column decoder circuitry select columns C1 and C2 at the same time, and select columns C3 and C4 at the same time.

20. The memory of claim 16 wherein for each burst operation of Table 1 having a burst length of 8, when eight columns C1, C2, C3, C4, C5, C6, C7, C8 are to be accessed in the order recited, the first column decoder circuitry and the second column decoder circuitry select columns C1 and C2 at the same time, select columns C3 and C4 at the same time, select columns C5 and C6 at the same time, and select columns C7 and C8 at the same time.

21. The memory of claim 16 wherein the memory is a synchronous dynamic random access memory.

22. The memory of claim 21 wherein the memory is a double data rate memory.

23. A method for accessing a memory in a burst operation, the method comprising:

simultaneously selecting an even column and an odd column of the memory in the burst operation, wherein the even and odd columns satisfy at least one of the following conditions (A) and (B):
 (A) the even and odd columns have non-consecutive column addresses;
 (B) the even and odd columns have consecutive column addresses starting at an odd column address boundary;

transferring data in parallel between the two selected columns and a data buffer; and serially transferring data between the data buffer and one or more terminals of said memory.

24. The method of claim 23 wherein the burst operation is one of the operations of Table 1 having a burst length of 4, sequential mode, and the least significant starting column address bit AY[0] equal to 1; and when four columns C1, C2, C3, C4 are to be accessed in the order recited, the columns C1 and C2 are selected simultaneously, and columns C3 and C4 are selected simultaneously.

25. The method of claim 23 wherein the burst operation is one of the operations of Table 1 having a burst length of 8, sequential mode, and the least significant starting column address bit AY[O] equal to 1; and when eight columns C1, C2, C3, C4, C5, C6, C7, C8 are to be accessed in the order recited, the columns C1 and C2 are selected at the same time, columns C3 and C4 are selected at the same time, columns C5 and C6 are selected at the same time, and columns C7 and C8 are selected at the same time.

26. The method of claim 23 wherein the memory is a synchronous dynamic random access memory.

27. The method of claim 26 wherein the memory is a double data rate memory.

* * * * *